(12) United States Patent
Schutte et al.

(10) Patent No.: US 7,914,694 B2
(45) Date of Patent: Mar. 29, 2011

(54) SEMICONDUCTOR WAFER HANDLER

(75) Inventors: Christopher L. Schutte, Richardson, TX (US); George T. Wallace, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 685 days.

(21) Appl. No.: 11/924,776

(22) Filed: Oct. 26, 2007

(65) Prior Publication Data

US 2008/0045017 A1 Feb. 21, 2008

Related U.S. Application Data

(60) Continuation of application No. 10/802,951, filed on Mar. 16, 2004, now abandoned, and a division of application No. 10/287,350, filed on Nov. 4, 2002, now Pat. No. 6,729,947.

(51) Int. Cl.
*C03C 15/00* (2006.01)
*C03C 25/68* (2006.01)

(52) U.S. Cl. .......................................... 216/89; 438/692

(58) Field of Classification Search ................ 216/89; 438/692; 156/345.12
See application file for complete search history.

(56) References Cited

U.S. PATENT DOCUMENTS

| | | |
|---|---|---|
| 3,034,527 A | 5/1962 | Hennells |
| 5,772,773 A | 6/1998 | Wytman |
| 5,810,325 A | 9/1998 | Carr |
| 5,954,912 A | 9/1999 | Moore |
| 5,957,149 A | 9/1999 | Karg |
| 6,227,950 B1 | 5/2001 | Hempel et al. |
| 6,537,143 B1 | 3/2003 | Yang et al. |
| 6,572,462 B1 | 6/2003 | Vanell |
| 6,592,675 B2 | 7/2003 | Nishikawa |
| 6,660,126 B2 | 12/2003 | Nguyen et al. |
| 6,716,086 B1 | 4/2004 | Tobin |
| 6,729,947 B1 | 5/2004 | Schutte et al. |
| 6,782,746 B1 | 8/2004 | Hasselbrink et al. |

*Primary Examiner* — Roberts Culbert
(74) *Attorney, Agent, or Firm* — Jacqueline J. Garner; Wade J. Brady, III; Frederick J. Telecky, Jr.

(57) ABSTRACT

A semiconductor wafer handler comprises a ring (70) attached to a hub (80) by a plurality of spokes (90). Vacuum is applied to the surface of the semiconductor wafer through orifices (100) containing in the ring (70). Water and/or nitrogen can be applied to the surface of the semiconductor wafer through orifices (110) contained in the spokes (90).

2 Claims, 3 Drawing Sheets

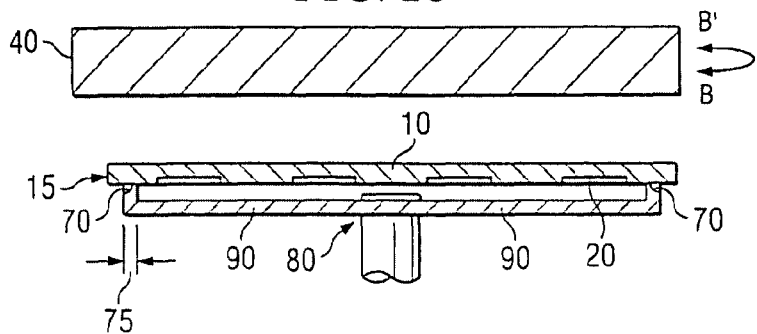
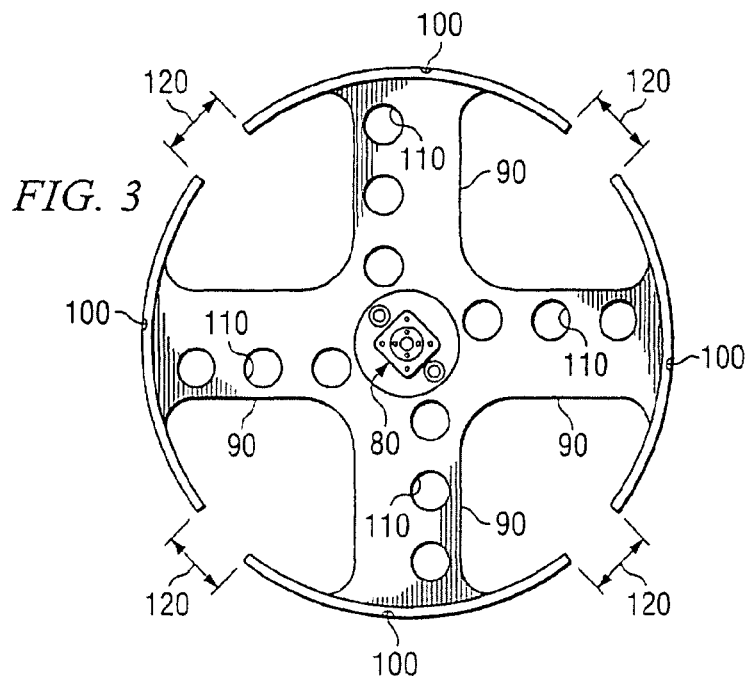
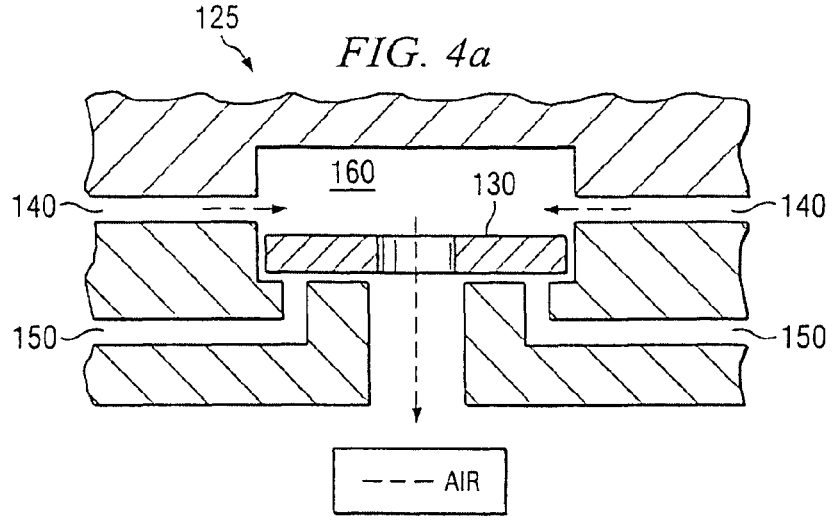

SEMICONDUCTOR WAFER HANDLER

CROSS-REFERENCE TO RELATED APPLICATIONS

This is a continuation of pending application Ser. No. 10/802,951, filed Mar. 16, 2004; which is a division of application Ser. No. 10/287,350, filed Nov. 4, 2002 (U.S. Pat. No. 6,729,947), both the citation of which are implied herein by reference.

FIELD OF THE INVENTION

The present invention relates to a semiconductor processing apparatus for improved semiconductor wafer handling for face-down processing applications.

DESCRIPTION OF RELATED ART

It is very important in semiconductor manufacturing that a minimum number of particles be introduced onto the surface of the semiconductor wafer during processing. In most semiconductor manufacturing the machines, apparatus, or tools used in manufacture do not directly contact the front surface or front-side of the wafer where the integrated circuits are formed. In general these semiconductor processing tools handle the wafers by contacting the back surface or backside during wafer transport and processing. Some processes such as chemical mechanical polishing (CMP) however do not readily lend themselves to handling the wafers by the backside only and in these processes contact is made to front-side of the wafer during processing.

Shown in FIG. 1 is a typical scheme used to handle wafers during the CMP process. In FIG. 1(a) the wafer 10 is loaded from a cassette unto the pedestal front-side down by a robot arm. The cassette and robot are not shown for clarity. The front-side 20 of the wafer 10 is in contact with the pedestal 30 and is held in place by vacuum. In operation, the pedestal moves up along the AA' axis before wafer loading to stage the backside 15 of the wafer 10 for transfer to the wafer handler 40. The wafer 10 is held against the surface of the wafer handler by a vacuum during wafer processing. After loading the wafer 10 unto the wafer handler 40 the wafer handler moves along the path BB' to begin CMP of the surface 20 of the wafer 10. In this type of scheme the surface 20 of the wafer 10 is polished front-side down. Although the backside 15 of the wafer 10 is held against the wafer handler 40 during the actual polishing, the pedestal 30 contacts the front-side 20 of the wafer during transport too and from the wafer handler 40.

A top view of the pedestal 30 is shown in FIG. 1(b). Also shown in FIG. 1(b) are holes 60 in the surface of the pedestal where nitrogen, water, or a vacuum can be applied to the surface of the wafer. During the wafer transfer process up to 80% of the front-side 20 surface of the wafer comes into contact with the pedestal. This allows particles to be transferred to the surface of the wafer after CMP that results in diminished wafer yields of functional integrated circuits. There is therefore a need for improved semiconductor apparatus or tools that reduce the tool contact with the front-side of the wafer during transport and/or processing.

SUMMARY OF THE INVENTION

The instant invention comprises an improved semiconductor wafer handler. In a first embodiment of the instant invention the improved wafer handler comprises a ring with an upper surface and orifices for applying a vacuum to the surface of a semiconductor wafer. The ring is attached to a hub through spokes that are affixed at either end to the ring and the hub. There are orifices in the spokes through which water and nitrogen can be passed unto the surface of said semiconductor wafer. In a further embodiment a diverter valve is contained in the hub.

In a further embodiment of the instant invention a CMP processing tool with improved wafer handling comprises a wafer handler for holding a semiconductor wafer while processing and a pedestal for loading and unloading the semiconductor wafer to the wafer. The pedestal further comprises a ring with an upper surface and orifices for applying a vacuum to the surface of a semiconductor wafer. The ring is attached to a hub by spokes that contain orifices through which water and nitrogen can be passed unto the surface of a semiconductor wafer.

In a further embodiment the improved wafer handler further comprises a diverter valve comprising a housing with an internal top surface and an internal bottom surface and a valve ring contained in the housing such that the valve ring moves to the internal bottom surface on the application of a vacuum in the housing. In addition the diverter valve further comprises a plurality of tubes connected to the internal bottom surface such that the valve ring covers the plurality of tubes when a vacuum is applied to the housing.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which:

FIGS. 2(a) and 2(b) are diagrams of an improved pedestal for holding semiconductor wafers according to an embodiment of the instant invention.

FIG. 3 is a diagram of a further embodiment of the instant invention.

FIGS. 4(a) and 4(b) are cross-sectional diagrams of a diverter valve.

DETAILED DESCRIPTION OF THE PREFERRED EMBODIMENTS

Figure 1A:
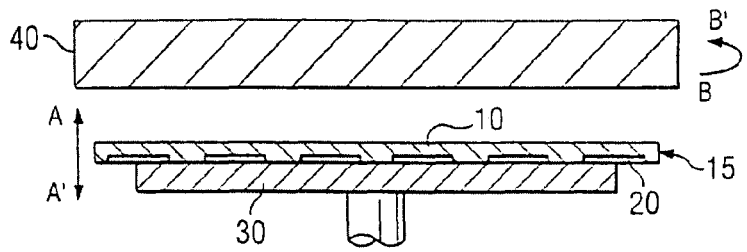
FIGS. 1(a) and 1(b) are diagrams of apparatus used to transport semiconductor wafers according to the prior art.
Figure 1B:
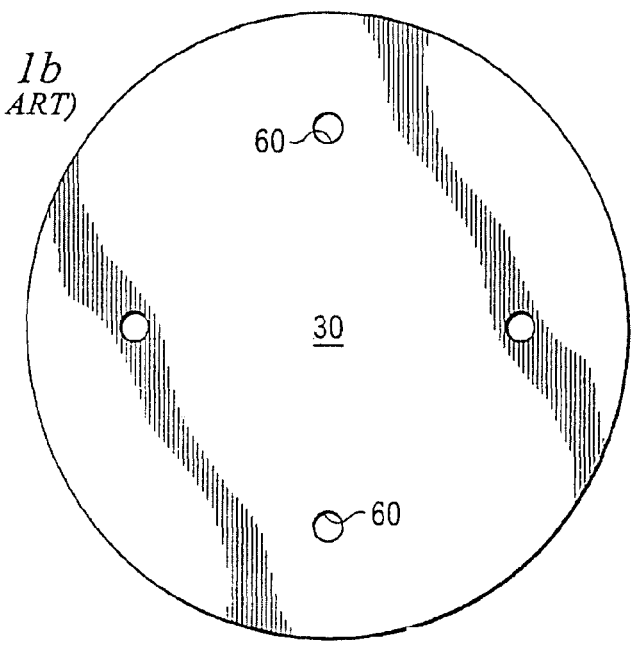
Figure 2A:
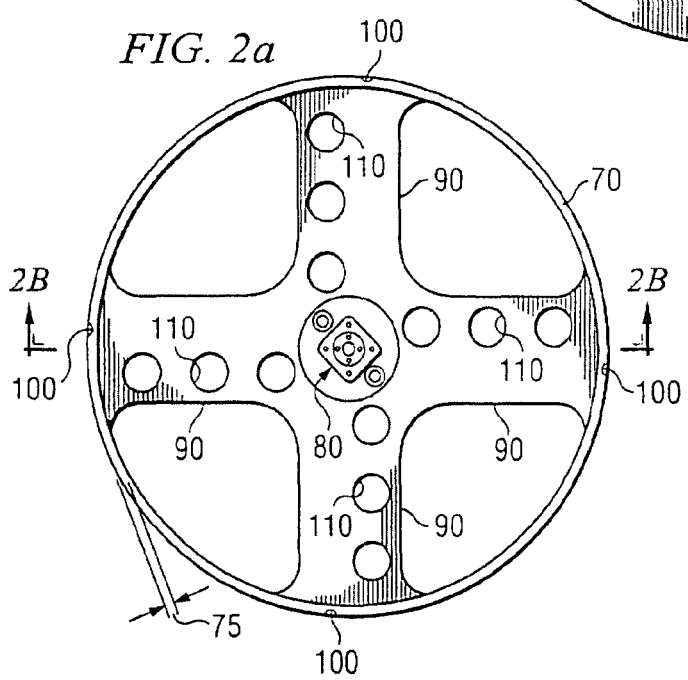

Shown in FIGS. 2(a) and 2(b) are diagrams of an embodiment of an improved pedestal for holding semiconductor wafers front-side down. As shown in FIG. 2(a) the pedestal comprises a circular ring 70 with a thickness 75 of 0.10 to 0.30 inches. The ring 70 is the only portion of the pedestal that contacts the wafer 10. The diameter of the circular ring is such that the upper surface of the ring 70 only contacts the edge of the wafer. The edge of the wafer does not contain functional integrated circuits. Therefore if particles are introduced onto the edge of the wafer the yield of functional integrated circuits derived from the wafer is unaffected. The wafer is held against the upper surface of the ring 70 by the application of a vacuum through the orifices 100 which are positioned on the ring 70. The ring 70 is held in place by a plurality of spokes 90 that are attached to a hub 80 that comprises the deflector valve and attaches the pedestal assembly to the semiconductor-processing tool. Nitrogen gas and/or water are supplied through the orifices 110 positioned along the various spokes 90 of the pedestal and is used to clean the front-side 20 of the wafer as well as push the wafer off the pedestal during the transfer of the wafer to a wafer handler positioned above the pedestal.

Shown in FIG. 2(b) is a cross section through the pedestal through the line DD'. A wafer 10 is shown on the pedestal. The edge of the wafer sits on the upper surface of the ring 70. The upper surface of the ring 70 is positioned at a higher level than the upper surface of the spokes 90 and the hub 80. Thus when the edge of the wafer sits on the upper surface of the ring 70, the remainder of the front-side 20 of the wafer 10 sits above the upper surface of the hub 80 and the spokes 90. The number of particles transferred to the wafer from the pedestal in the instant invention is therefore greatly reduced compared to the number of particles transferred by the pedestal used in the prior art. In operation the wafer 10 is transferred to the pedestal of the instant invention by a robot arm not shown for clarity. After placing the wafer on the upper surface of the ring 70, a vacuum is created through the holes 110 which secure the wafer to the surface of the ring 70. After placement of the wafer 10 on the ring 70 and before the application of the vacuum any number of steps could be performed such as wafer alignment. Following the application of the vacuum, the entire pedestal is moved upwards to stage the backside of the wafer 15 for transfer to a wafer handler 40. Upon the application of a vacuum to affix the backside of the wafer 15 to the wafer handler, the vacuum holding the wafer to the ring 70 is released followed by the passing nitrogen through all the holes 110, 100 in the spokes 90 and on the ring 70 to push the wafer off the surface of the ring 70 and up against the wafer handler 40. The wafer handler 40 then moves the wafer to other sections of the processing tool where various processes are performed such as CMP. Following the completion of the processes to be performed the ring 70 is positioned below the wafer handler 40. The wafer handler 40 is then positioned so that the upper surface of the ring 70 is in contact with the edge of the wafer. Vacuum is applied to orifices 100 in the ring 70 to affix the wafer 10 to the ring 70. The vacuum holding the wafer to the wafer handler 40 is released and the wafer is removed from the pedestal and placed in a cassette by a robot arm. While the wafer is being removed from the pedestal by the robot arm water and/or nitrogen can be forced from all the orifices 100, in the pedestal and unto the surface 20 of the wafer 10 to remove particles that may have been introduced unto the surface 20 during handling and processing.

In addition to the embodiment shown in FIGS. 2(a) and 2(b) other embodiments of the instant invention are contemplated. For example in a further embodiment of the instant invention any number of spokes can be used to hold the ring 70 in place. The invention is therefore not limited to the four spokes 90 shown in FIG. 2(a). In addition the ring 70 shown in FIG. 2(a) forms a complete circle. However the surface that supports the wafer does not have to form a complete circle. Gaps 120 may be present in certain regions of the ring or contact area as shown in FIG. 3. In a further embodiment of the instant invention the spokes 90 and hub 80 will cause ring 70 to rotate in a clockwise or anti-clockwise direction during the period when water and/or nitrogen is sprayed on the surface of the wafer 20. This rotation will enhance the cleaning effect of the water and/or nitrogen.

Figure 4B:
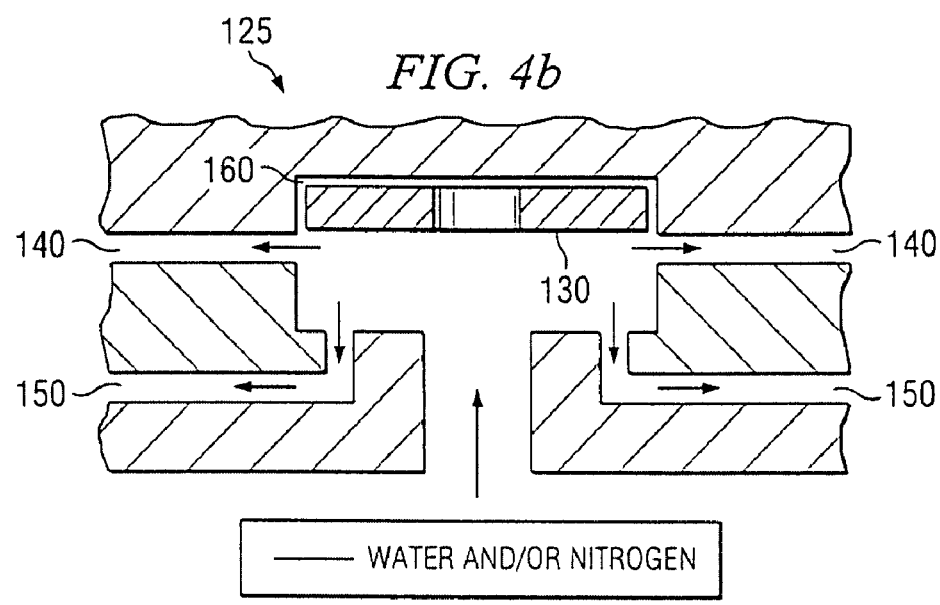

Shown in FIGS. 4(a) and 4(b) are cross-sectional diagrams of a diverter valve 125 which is contained in the hub 80 of the pedestal. The diverter valve functions to direct the flow of air to create a vacuum as well as the flow of nitrogen and/or water unto the surface of the wafer. Although in the described embodiment the diverter valve is contained in the hub 80, the diverter valve can be placed in any location on the processing tool. Shown in FIG. 4(a) is the diverter valve 125 when vacuum is formed at the orifices 100 in the ring 70 to hold the wafer 10 unto the surface of the ring 70. The diverter valve comprises a housing 160 that contains a valve ring 130 and tubes 140, 150 for the application of the vacuum or the flow or nitrogen and/or water. The valve ring 130 is a flat disc with one or a number of holes through which air can flow. The tubes 140 coming from the housing 160 are connected to the orifices 100 on the ring while the tubes 150 are connected to the orifices 110 on the spokes 90. With the wafer on the ring, a vacuum is created by causing the flow of air in the direction shown in FIG. 4(a). A pump or some other apparatus can be used to produce the required airflow. The reduction in pressure will cause the valve ring 130 to move to the internal bottom surface of the housing 160 and block the opening to the tubes 150 connected there. This causes a vacuum to be created at the orifices 100 on the ring 70 that then hold the wafer to the surface of the ring 70. Shown in FIG. 4(b) is the position of the valve ring 130 when water and/or nitrogen is being applied to the surface of the wafer through the orifices 110. In this case water and/or nitrogen is forced into the housing in the direction shown by the arrows in FIG. 4(b). The water and/or nitrogen will force the valve ring 130 to the internal top surface of the housing 160 allowing the water and/or nitrogen to flow through the tubes 140, 150 and out of the orifices 100, 110 unto the surface of the wafer. Although the operation of the diverter valve was described using water and/or nitrogen any suitable gas and liquid can be flowed through the diverter valve and orifices 100, 110 to clean the surface of the wafer. In addition the diverter valve shown in FIGS. 4(a) and 4(b) have four tubes connected to the housing 125. It should be noted that the invention is not limited to four tubes and any number of tubes can be connected to the housing.

Figure 5:
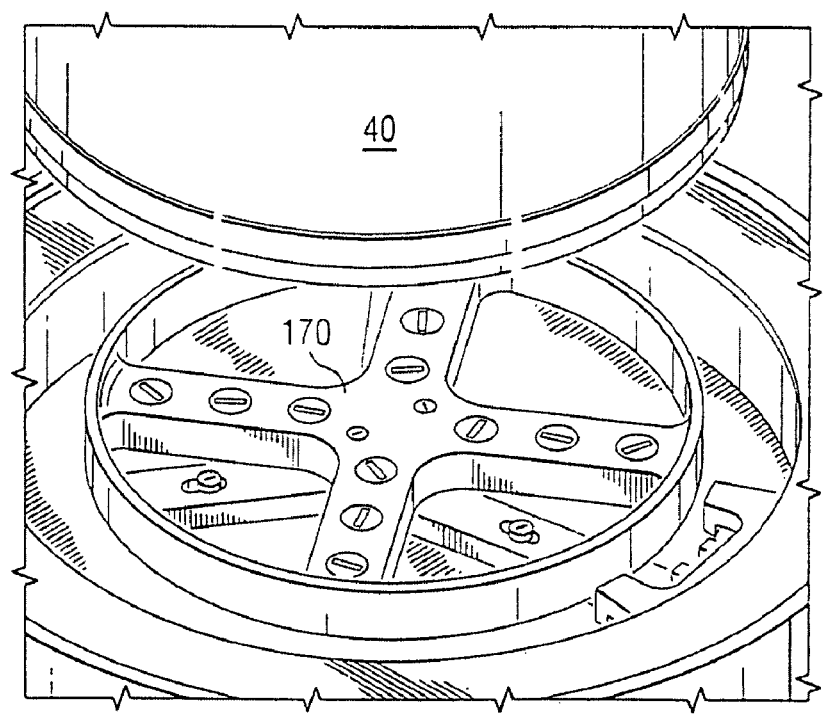
FIG. 5 is a photograph of an embodiment of the instant invention.

Shown in FIG. 5 is a photograph of the pedestal 170 of an embodiment of the instant invention in a CMP processing tool. The wafer handler 40 is shown above the pedestal 170. The wafer handler 40 loads and unloads the wafer face-down and moves the wafer to other sections of the CMP tool for processing. The pedestal 170 stages the wafer for the wafer handler 40.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

What is claimed is:

1. A method of chemical mechanical polishing, comprising:
   providing a semiconductor wafer;
   providing a pedestal comprising a central hub, a ring and spokes connecting the ring to the central hub;
   placing the semiconductor wafer on the pedestal such that a surface of the semiconductor wafer contacts only an upper surface of the ring and does not contact an upper surface of the spokes and an upper surface of the hub;
   moving the pedestal in a vertical manner and affixing a second surface of the semiconductor wafer to a wafer handler wherein said second surface of said semiconductor wafer is opposite said first surface of said semiconductor wafer;
   applying water from said ring to the first surface of the semiconductor wafer to push the semiconductor wafer from said ring during said affixing of said semiconductor wafer; and processing the semiconductor wafer using chemical mechanical polishing; and removing the semiconductor wafer from said wafer handler.

2. The method of claim 1 further comprising cleaning the surface of the semiconductor wafer by applying water to the first surface of the semiconductor wafer at positions between the ring and the hub following said removing of said semiconductor wafer from said wafer handler.

* * * * *